United States Patent
Luzzi et al.

(10) Patent No.: US 9,369,120 B2
(45) Date of Patent: Jun. 14, 2016

(54) DETECTOR CIRCUIT, TRANSPONDER AND METHOD FOR DETECTING SIGNAL AMPLITUDES

(75) Inventors: Raimondo Luzzi, Graz (AT); Marco Bucci, Graz (AT)

(73) Assignee: Infineon Technologies AG, Neubiberg (DE)

( * ) Notice: Subject to any disclaimer, the term of this patent is extended or adjusted under 35 U.S.C. 154(b) by 655 days.

(21) Appl. No.: 13/006,520

(22) Filed: Jan. 14, 2011

(65) Prior Publication Data
US 2012/0183100 A1    Jul. 19, 2012

(51) Int. Cl.
*H03K 9/02*    (2006.01)
*H04L 27/06*   (2006.01)

(52) U.S. Cl.
CPC . *H03K 9/02* (2013.01); *H04L 27/06* (2013.01)

(58) Field of Classification Search
CPC ......... H04L 27/06; H04L 7/033; H04L 27/38; H03K 9/02; G06K 19/0723
USPC ........................... 375/244, 293, 308, 317, 320
See application file for complete search history.

(56) References Cited

U.S. PATENT DOCUMENTS

| | | | | |
|---|---|---|---|---|
| 4,355,408 A * | 10/1982 | Scarrott | ................... | H04L 7/033 360/51 |
| 4,646,322 A * | 2/1987 | Flanagin | ............... | H03M 3/024 375/244 |
| 6,452,522 B1 * | 9/2002 | Wahlberg | ............... | H03M 3/022 341/120 |
| 7,215,721 B2 * | 5/2007 | Hietala | ................... | H04L 1/004 375/317 |
| 7,366,251 B2 * | 4/2008 | Luhman | ................ | H04L 7/0008 375/295 |
| 7,936,166 B2 * | 5/2011 | Olivieri | ................ | H03K 5/1532 324/207.18 |
| 8,045,648 B2 * | 10/2011 | Jun | ................... | G06K 19/07749 375/320 |
| 8,798,175 B2 * | 8/2014 | Allen | ...................... | H04L 7/008 375/257 |
| 2005/0094745 A1 * | 5/2005 | Miyanaga | ............... | H04L 27/06 375/320 |
| 2008/0079557 A1 | 4/2008 | Alicot et al. | | |
| 2008/0106450 A1 | 5/2008 | Prestros | | |
| 2009/0046809 A1 * | 2/2009 | Meltzer | ................... | H04L 27/06 375/308 |
| 2010/0027710 A1 * | 2/2010 | Fukuda | ................... | H04L 27/02 375/293 |

FOREIGN PATENT DOCUMENTS

| | | |
|---|---|---|
| CN | 101640948 A | 2/2010 |
| DE | 102006051981 A1 | 5/2008 |
| JP | 2010276594 A | 12/2010 |

OTHER PUBLICATIONS

B. Gomez et al. "A 3.4Mb/s RFID Front-end for Proximity Applications Based on a Delta-modulator." 2006 IEEE International Solid-State Circuits Conference, Session 17.3. Feb. 7, 2006. Grenoble, France. pp. 1-8.

* cited by examiner

*Primary Examiner* — Daniel Washburn
*Assistant Examiner* — Eboni Hughes
(74) *Attorney, Agent, or Firm* — Murphy, Bilak & Homiller, PLLC

(57) ABSTRACT

A transponder circuit for receiving and processing an ASK signal having modulated communication information is provided. The transponder circuit includes a data receiver configured to receive the ASK signal. A reference clock extractor coupled to the data receiver is configured to extract a reference clock signal from the ASK signal. An amplitude determination unit is coupled to the data receiver and the reference clock extractor, and is configured to determine at least one amplitude value of the received ASK signal in at least one clock cycle of the extracted reference clock signal based on the extracted reference block. A processing unit, which is coupled to the amplitude determination unit, processes the amplitude value such that the communication information is retrieved.

18 Claims, 13 Drawing Sheets

DETECTOR CIRCUIT, TRANSPONDER AND METHOD FOR DETECTING SIGNAL AMPLITUDES

TECHNICAL FIELD

Embodiments of the present invention are directed to a circuit arrangement for detecting amplitudes of signals containing data of varying amplitudes, and more particularly to a transponder circuit for receiving, transmitting and/or processing ASK (amplitude shift keying) modulated signals having modulated communication information and a method for demodulating varying amplitude data in a contactless device.

BACKGROUND

Data having varying amplitude, such as e.g., ASK (amplitude shift keying) modulated signals, are used in many devices for transmitting communication information from a sender to a receiver. Contactless transponders may communicate with a reader unit using ASK modulation. For ASK modulation, different modulation indexes are defined such as the indexes presented in the ISO 14443 Standard. A first modulation index is provided by type A communication and represents a modulation degree of approximately 100%. A second type of modulation index is represented by type B communication which includes modulation depths of typically 10%.

A type A demodulator may be provided by a comparator unit which has a threshold value close to zero, whereas for the type B demodulator, a filtering operation is required. The filtering operation is introduced because an absolute voltage threshold cannot be defined. Furthermore, in type B modulation systems, a modulated level may change in accordance with the non-modulated level, and an actual modulation index thus may vary between 6% and 30%.

Thus voltage demodulation in a contactless transponder is based on an envelope detector which includes diodes, capacitances and load components. Furthermore, a post-processing circuit may be devised for recovering digital information from the signal envelope. In order to provide demodulation of type A and type B communication signals (i.e., signals having a modulation depth of approximately 100% and signals having a modulation depth of approximately 10%, respectively), two different types of demodulators are provided in the transponder circuit.

It is thus an issue to provide a reliable, accurate and cost-effective circuit arrangement for retrieving communication information contained in varying amplitude data.

SUMMARY

Embodiments described herein refer inter alia to a detector circuit for detecting at least one amplitude value of varying amplitude data. The detector circuit includes a data receiver which is connectable to an antenna unit and configured to receive the varying amplitude data. A reference clock extractor coupled to the data receiver is configured to extract a reference clock signal from the varying amplitude data. Furthermore, an amplitude determination unit is provided which is connected to both the data receiver and the reference clock extraction means. The amplitude determination unit is configured to determine the at least one amplitude value of the received varying amplitude data in at least one clock cycle of the extracted reference clock signal based on the extracted reference clock signal.

Furthermore, embodiments described herein refer inter alia to a transponder circuit for receiving, transmitting and/or processing a varying amplitude signal having modulated communication information. As used herein, the expression transponder circuit includes circuits, e.g., for transmitting communication signals and for responding to acquired communication signals. According to embodiments which can be combined with other embodiments described herein, the transmission of transponder signals is based on ASK (amplitude shift keying) modulation. The ASK signal may be modulated in accordance with a bit stream containing communication information.

The transponder circuit may include a data receiver configured to receive the ASK signal. Moreover, a reference clock extractor is provided which is coupled to the data receiver and which is configured to extract a reference clock signal from the ASK signal. An amplitude determination unit is coupled to the data receiver and the reference clock extractor and is configured to determine at least one amplitude value of the received ASK signal in at least one clock cycle of the extracted reference clock signal based on the extracted reference clock signal. A processing unit, which is coupled to the amplitude determination unit, is configured to process the amplitude value such that communication information contained in the ASK signal may be retrieved.

In addition, embodiments described herein refer inter alia for a method for demodulating an ASK signal having modulated communication information. The method includes receiving the ASK signal, extracting a reference clock signal from the ASK signal, determining at least one amplitude value of the retrieved ASK signal in at least one clock cycle of the extracted reference clock signal based on the extracted reference clock signal, converting the determined amplitude value into a digital output signal, and retrieving the communication information from the digital output signal.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Figure 1:
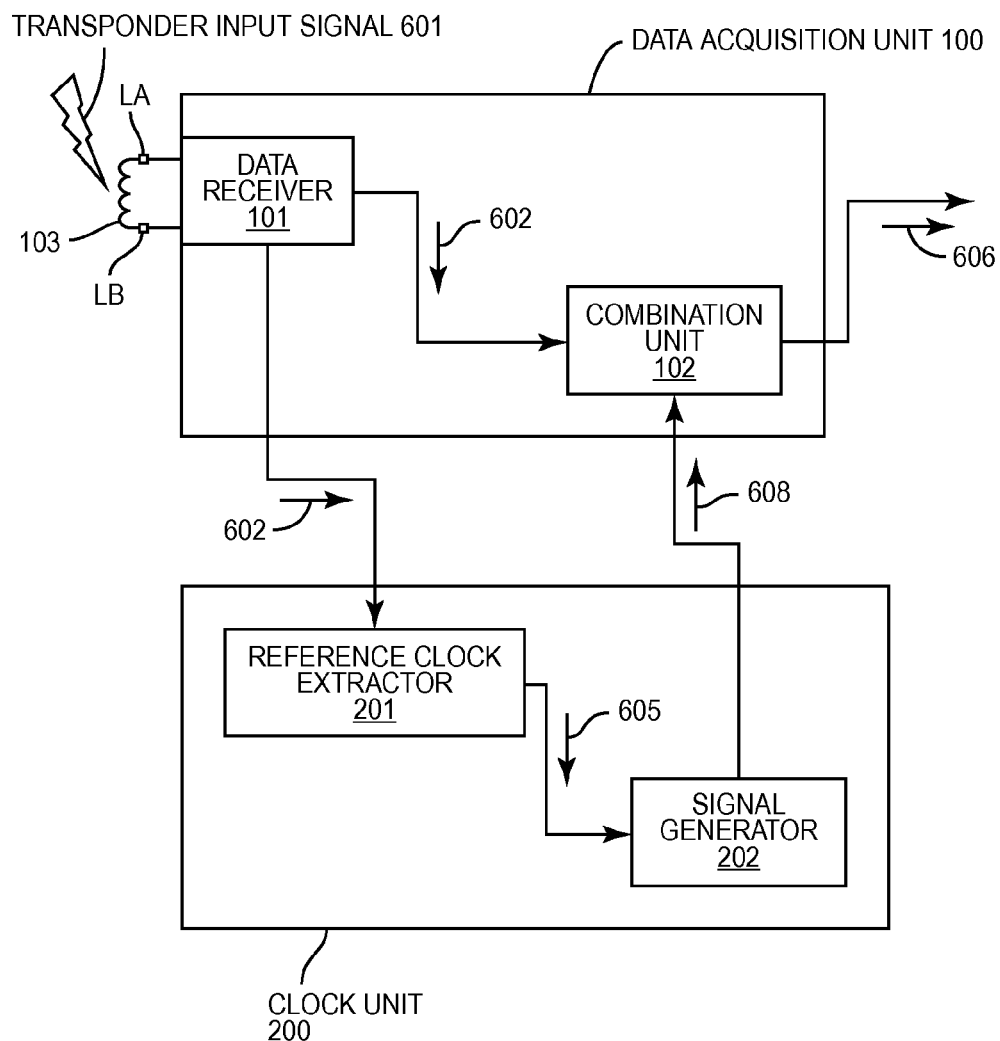
FIG. 1 shows a schematic block diagram of a detector circuit including a data acquisition unit and a clock unit for extracting a reference clock signal, according to an embodiment.

FIG. 1 is a schematic block diagram illustrating a detector circuit 500 in accordance with an embodiment. The detector circuit 500 includes a data acquisition unit 100 and a clock unit 200. The data acquisition unit 100 includes a data receiver 101 connected to an antenna unit 103. The antenna unit 103 has two connection nodes LA and LB, where respective half waves of a transponder signal 601 received by the antenna unit 103 are present.

The data acquisition unit 100 also includes a combination unit 102 for combining both half waves of the transponder input signal 601. The transponder input signal 601, which is acquired by the antenna unit 103, is forwarded to the data receiver 101. The data receiver 101 outputs varying amplitude data 602, e.g., data representing an ASK (amplitude shift keying) modulated signal. The varying amplitude data (ASK signal) 602 is provided to the clock unit 200. Within the clock unit 200, a reference clock extractor 201 is provided which processes the varying amplitude data 602 in order to obtain a reference clock signal 605. From the varying amplitude data 602, the reference clock extractor 201 extracts the reference clock signal 605.

The procedure involved in extracting the reference clock signal 605 from the varying amplitude data 602 is described below with reference to FIG. 5. The reference clock signal 605 may be used as a reference clock for other circuit components of the detector circuit 500 (not shown in FIG. 1). Furthermore, the reference clock signal 605 may be directed to a control signal generator 202 which generates at least one control signal 608 in response. The control signal 608 may be a set sample signal, a reset sample signal, a locking signal, or any combinations thereof, as detailed below.

In the circuit arrangement shown in FIG. 1, the control signal 608 is received by the combination unit 102 of the data acquisition unit 100. The combination unit 102, which is coupled to both the data receiver 101 and the control signal generator 202, combines both half waves of the received varying amplitude data 602 and provides a detection signal 606. The detection signal 606 is output from the data acquisition unit 100.

The procedure for obtaining an amplitude value 606a of the detection signal 606 in at least one clock cycle of the extracted reference clock signal 605 on the basis of the extracted reference clock signal 605 is described below with reference to FIG. 6. According to an embodiment, which can be combined with other embodiments described herein, the detection signal 606, which is provided by the combination unit 102 on the basis of the extracted reference clock signal 605 (and/or the control signal 608), may be a maximum value of the varying amplitude data 602 within a specific clock cycle of the extracted reference clock signal 605 (see also FIG. 6).

Figure 2:
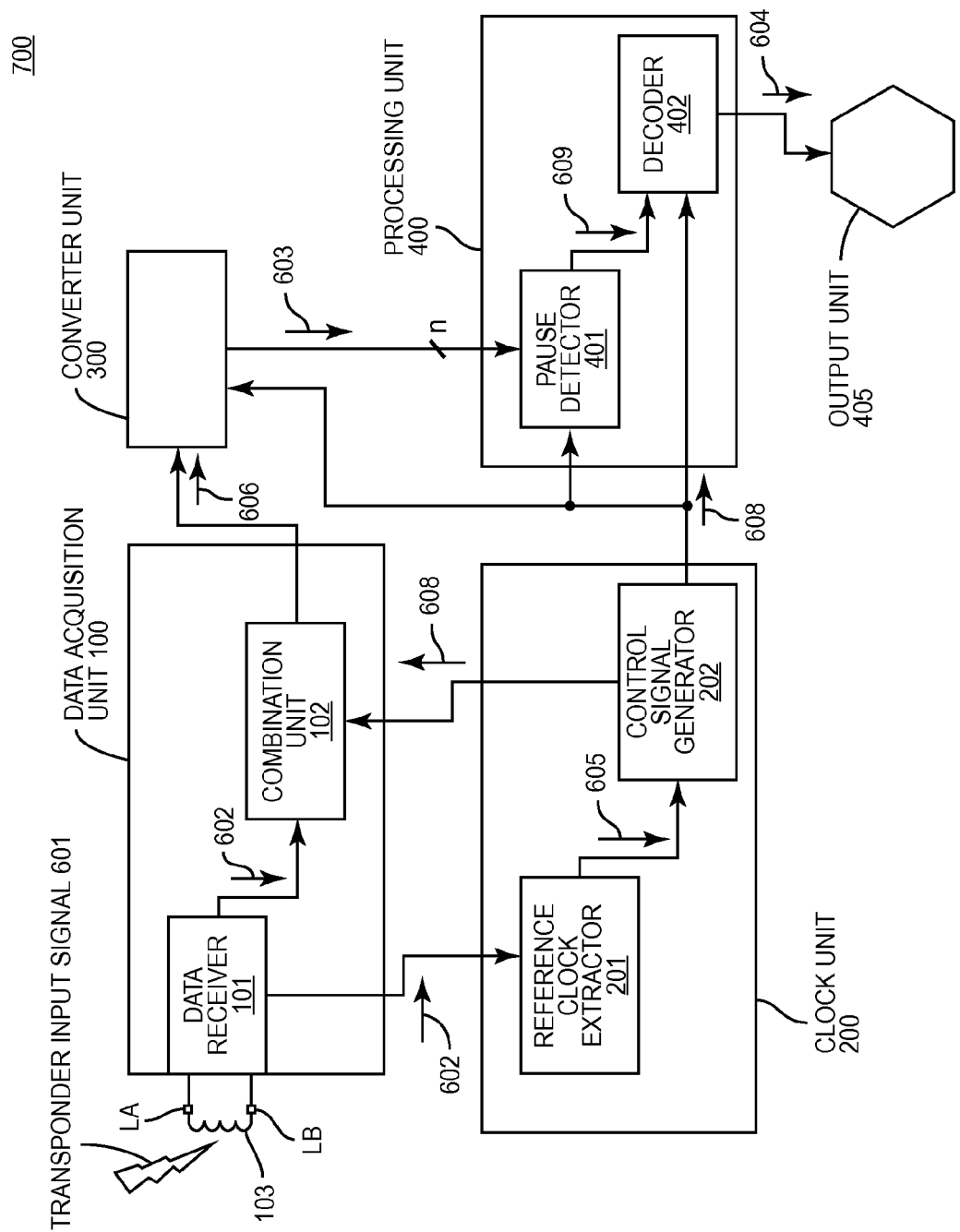
FIG. 2 shows a schematic block diagram of a transponder circuit for receiving a transponder input signal and outputting a decoded output signal, in accordance with an embodiment.

FIG. 2 is a block diagram illustrating a transponder circuit 700 in accordance with another embodiment. The transponder circuit 700 includes several circuit blocks operatively connected such as an antenna unit 103, a data acquisition unit 100, a clock unit 200, a converter unit 300, a processing unit 400 and an output unit 405.

The antenna unit 103 receives a transponder input signal 601 which is directed to the data receiver 101. The data acquisition unit 100 and the clock unit 200 correspond to circuit components which have been described already herein above with respect to FIG. 1. In order to avoid a redundant description, circuit components which have been described already with reference to FIG. 1, are not described here.

Thus, in a similar manner as compared to the procedure provided by the circuit arrangement described herein above with respect to FIG. 1, the combination unit 102 coupled to the data receiver 101 and the reference clock extractor 201 and/or the control signal generator 202 of the clock unit 200 provides the detection signal 606 of received varying amplitude data 602 in at least one clock cycle of the extracted reference clock signal 605, on the basis of the extracted reference clock signal 605.

The detection signal 606 is output to a converter unit 300 which may function as an amplitude determination unit, the operation of which is described in detail below with reference to FIG. 7. The converter unit 300 converts the input detection signal 606 into a digital output signal 603, e.g., a codeword n, on the basis of the control signal 608. The control signal 608 is derived from the reference clock signal 605 using the control signal generator 202 of the clock unit 200, as described below with respect to FIG. 4.

The processing unit 400 includes a pause detector 401 and a decoder 402 both designed to further process the digital output signal 603 in order to extract communication information. The pause detector 401 is used for retrieving pause intervals corresponding to communication information contained in the ASK signal 601 at the transponder input. A digital signal having specific pauses in between on-states thus may represent communication information. The pause detector 401 determines the pause signal 609 on the basis of the control signal 608.

Furthermore, the decoder 402, which is coupled to the pause detector 401, receives the pause signal 609 in order to provide a decoded output signal 604 output from the decoder 402. The decoder 402 decodes the pause signal 609 on the basis of the control signal 608, which is supplied from the control signal generator 202 of the clock unit 200. The decoder 402 outputs the decoded output signal 604 to the output unit 405. The decoded output signal 604 may be used for controlling other circuit components not shown in FIG. 2, on the basis of information contained in the ASK signal received by the antenna 103.

Figure 3:
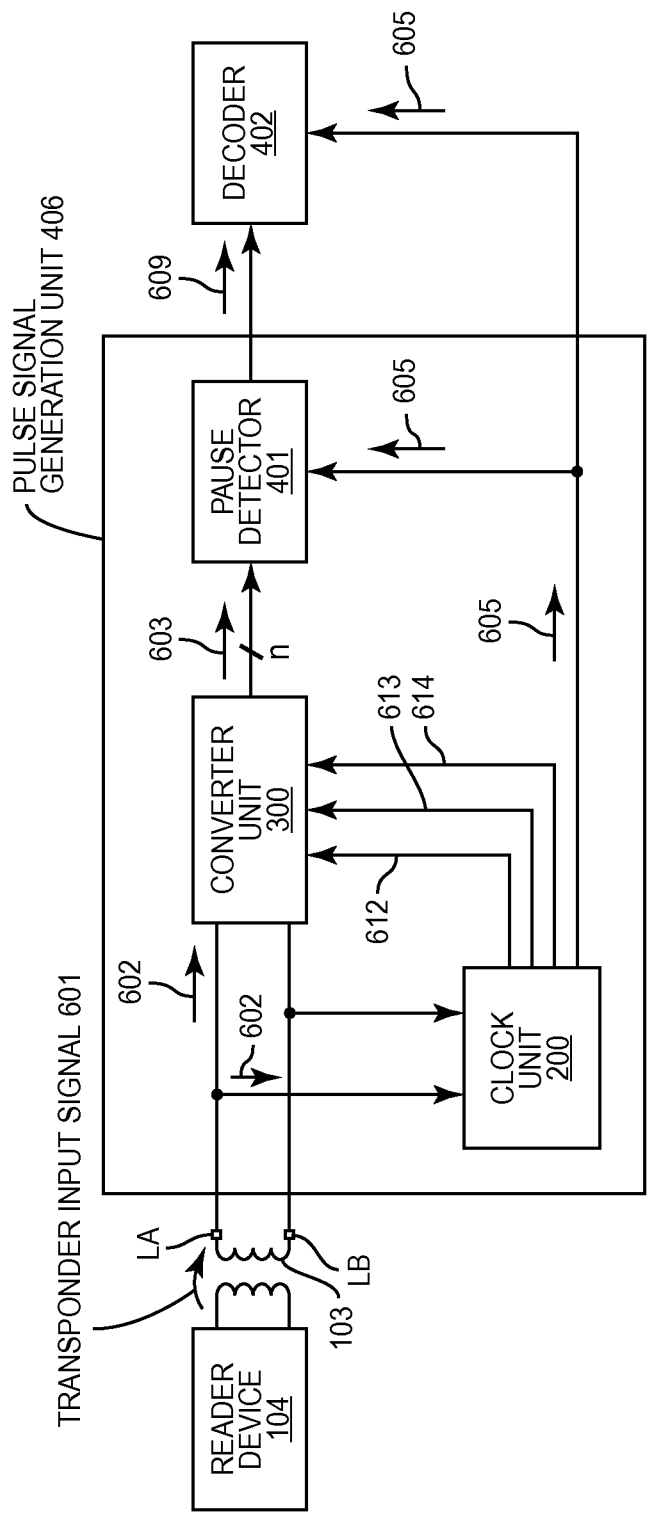
FIG. 3 is a detailed block diagram illustrating a transponder circuit and control signals for the circuit arrangement shown in FIG. 2.

FIG. 3 is a detailed block diagram of a pause signal generation unit 406 coupled to an antenna unit 103 and a decoder 402. The transponder signal 601 may be transmitted from a reader device 104 shown in FIG. 3, to the antenna unit 103. As described above with respect to FIGS. 1 and 3, varying amplitude data 602, e.g., an ASK signal, is directed to the converter unit 300. Furthermore, two clock signals are derived from the varying amplitude data 602 by the clock unit 200. The procedure for deriving both clock signals is described below with respect to FIG. 5.

The converter unit 300 outputs the digital output signal 603, i.e., a codeword n, and is coupled to the pause detector 401 such that the digital output signal 603 may be input to the pause detector 401. In the clock unit 200, the control signal generator 202 (see FIG. 1 and FIG. 2) generates the reference clock signal 605. In addition to that the clock unit 200, which is described below with reference to FIG. 4, generates control signals such as a set sample signal 612, a reset sample signal 613 and a locking signal 614.

The set sample signal 612, the reset sample signal 613 and the locking signal 614 are provided for the converter unit 300. On the basis of the set sample signal 612, the reset sample signal 613 and the locking signal 614, the converter unit 300 converts the input varying amplitude data 602 into the digital output signal 603. The digital output signal 603 then is transformed into the pause signal 609, which is described below with respect to FIGS. 6, 10 and 11. The conversion of the digital output signal 603 into the pause signal 609 by the pause detector 401 is carried out on the basis of the reference clock signal 605, which is provided by the clock unit 200.

Figure 4:
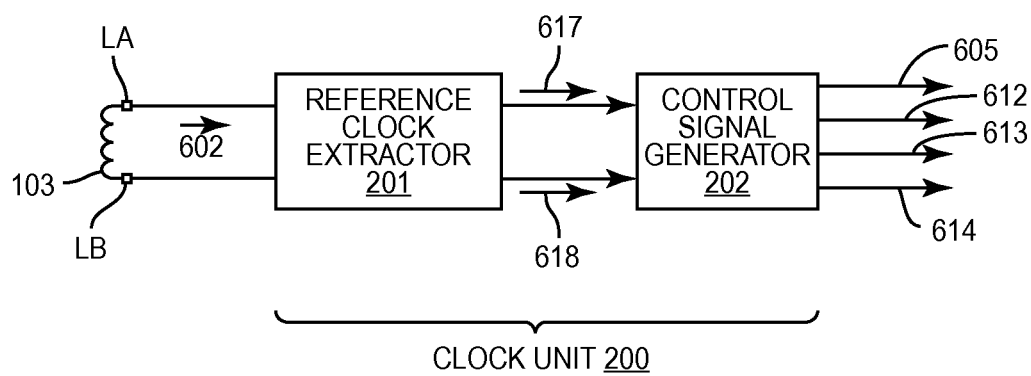
FIG. 4 is a detailed block diagram of a clock unit used in the embodiments shown in FIGS. 2 and 3.

FIG. 4 is a detailed block diagram of the clock unit 200 according to an embodiment. The clock unit 200 is connected to the antenna unit 103 by two connection nodes LA and LB, respectively. The input varying amplitude data 602 is received by the reference clock extractor 201.

According to embodiments which may be combined with other embodiments described herein, the reference clock extractor 201 may extract two clock signals, i.e., a first clock signal 617 and a second clock signal 618, and outputs the clock signals 617, 618 to the control signal generator 202. The extraction of the first and second clock signals 617 and 618, respectively, is described below with reference to FIG. 5. The control signal generator 202 generates, based on the first and second clock signals 617, 618, the reference clock signal 605, the set sample signal 612, the reset sample signal 613 and the locking signal 614, which are depicted in the signal timing diagram shown in FIG. 5.

Figure 5:
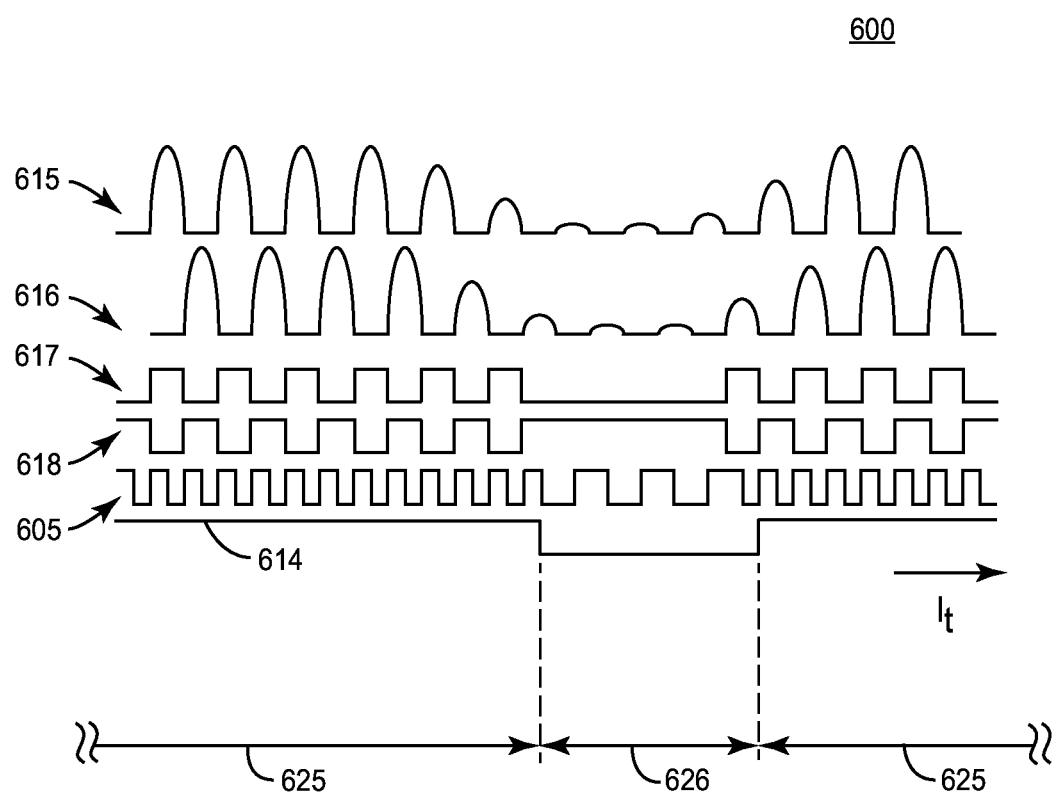
FIG. 5 is a graph illustrating a signal timing diagram of antenna, clock and locking signals provided by the transponder circuit described herein.

FIG. 5 is a signal timing diagram 600 illustrating the extraction of the reference clock signal 605 on the basis of first and second antenna input signals 615 and 616, respectively. As indicated in FIG. 5, the individual timing signals are sketched as a function of time t.

According to embodiments described herein, the first antenna input signal 615 is input via the node LA shown in FIG. 4, whereas the second antenna input signal 616 is input via the node LB shown in FIG. 4. The first and second antenna input signals 615, 616 are derived from the nodes LA and LB, respectively, i.e., the signals 615 and 616 may represent communication information represented by an ASK modulated signal.

As shown in FIG. 5, the envelopes of the first and second antenna input signals 615, 616 may vary from a high amplitude value in a locked region 625 to a low amplitude value in an unlocked region 626, and again may increase to a high amplitude value in another locked region 625 (from left to right in FIG. 5). In the locked regions 625 on the left and on the right side of the unlocked region 626 shown in FIG. 5, first and second clock signals are derived, i.e., the first clock signal 617 is derived from the first antenna input signal 615, and the second clock signal 618 is derived from the second antenna input signal 616. Although not shown in FIG. 5, a duration of high amplitude values and/or a duration of low amplitude values are independent of a locking of the clock unit 200, e.g., the unlocked region 626 shown in FIG. 5 may be different from the region where low amplitude values prevail, and the locked regions 625 may be different from regions where high amplitude values prevail.

As the antenna unit 103 is connected, at its both connection ends, to the nodes LA and LB, the second antenna signal 616 is shifted in time with respect to the first antenna signal 615. The time shift may correspond to a phase shift of approximately 180 degrees such that the maxima of the second antenna input signal 616 are positioned in time between adjacent maxima of the first antenna input signal, and vice versa. The two antenna input signals 615, 615 may be represented as rectified signals. According to an embodiment which may be combined with other embodiments described herein, the two antenna input signals 615, 616 may be half-signals, i.e., signals rectified by diodes D1, D2 shown in FIG. 7 and representing a half-wave rectifier. Thus, the second clock signal 618 derived from the second antenna input signal 616 may be inverted with respect to the first clock signal 617 derived from the first antenna input signal 615. Furthermore, both clock signals 617, 618 exhibit a repetition frequency of the received transponder input signal 601 explained herein above with respect to FIGS. 2 and 3. According to an embodiment the frequency of the received transponder input signal 601 may amount to approximately 13.56 MHz.

A signal trace denoted by a reference numeral 605 represents the reference clock signal which may derived from the first clock signal 617, the second reference signal 618, or from both the first and the second clock signals 617 and 618, respectively. As indicated in FIG. 5, the reference clock signal 605 exhibits twice the frequency of the first or the second clock signals 617, 618, e.g., a frequency of 2*13.56 MHz. Thus the reference clock signal 605 has a frequency which is twice the frequency of the individual first and second clock signal 617 and 618 within the locked regions 625.

During a pause, i.e., when the first antenna input signal 615 and the second antenna input signal 616 are below the threshold of the clock detector, which typically may be approximately one volt, the first and second clock signal 617 and 618 are stopped, while the reference clock signal 605 continues to run asynchronously at a lower frequency (at approximately 13.56 MHz in the case indicated in FIG. 5), i.e., the clock signal generator 202 then is in a free-running mode. Within the unlocked region 626, the frequency of the reference clock signal 605 may correspond to the frequency of the individual first and second clock signals 617 and 618, or the frequency of the reference clock signal 605 may correspond to frequency which is lower than twice the frequency of the individual first and second clock signals 617 and 618. Furthermore, the signal timing diagram 600 of FIG. 5 illustrates the locking signal 614 which defines the locked regions 625 (locking signal=on or high), and the unlocked region 626 (locking signal=off or low).

Figure 6:
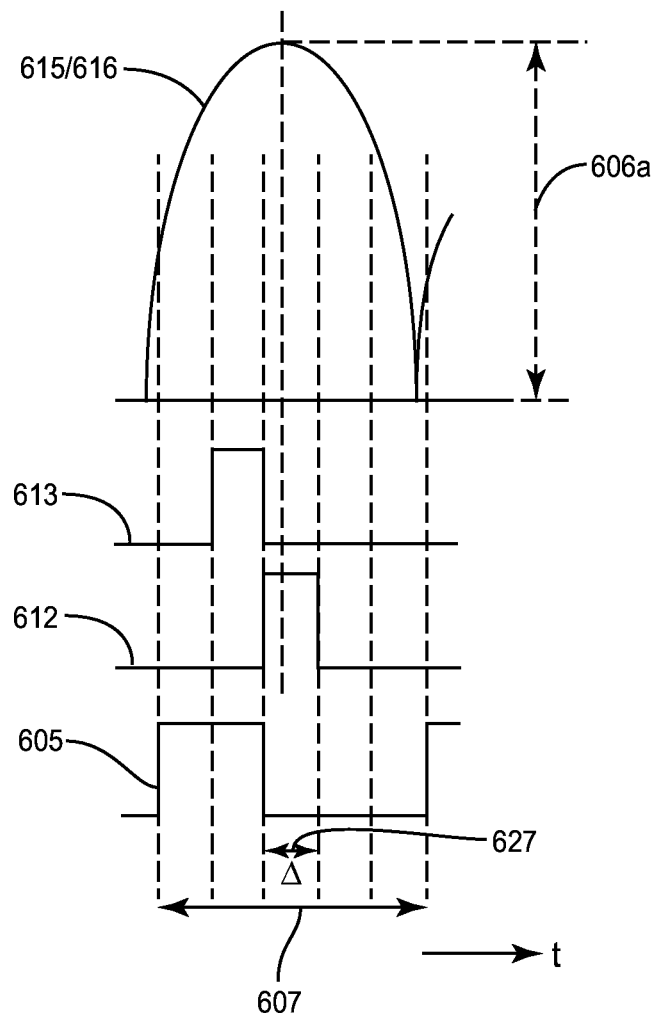
FIG. 6 is a graph illustrating a signal timing diagram including set sample and reset sample signals for determining an amplitude value of varying amplitude data, according to an embodiment.

FIG. 6 is a timing diagram illustrating the procedure which is carried out for determining at least one amplitude value 606a by an amplitude determination unit which is described with reference to FIG. 7 below. In the upper signal trace of FIG. 6, one half-period (half-wave) of at least one of the first antenna input signal 615 and the second antenna input signal 616 is depicted. A clock cycle 607 of the reference clock signal 605 which has been derived as explained with respect to FIG. 5, corresponds to the half-period.

As shown in FIG. 6, the reference clock signal 605 has a clock cycle 607 which may be divided into five approximately equal sample intervals 627. As the clock signal 605 is twice the frequency of the first and second antenna input signal 615, 616 and the first and second clock signal 617, 618 (see FIG. 5), a period of the clock cycle 607 corresponds to 1/(2*13.56) µs in the above example, because, according to e.g., ISO 14443 standard mentioned above, the input frequency at the antenna unit 103 corresponds to 13.56 MHz.

FIG. 6 also shows the set sample signal 612 and the reset sample signal 613 generated by the control signal generator 202 (see FIG. 4). The amplitude value 606a is measured at a time when the set sample signal 612 is on. Thus, an approximated maximum amplitude value 606a is detected and may be output by the amplitude determination unit.

In order to determine the envelope of the transponder signal 601 applied at the antenna unit 103, the amplitude value 606a of the antenna input signal 615, 616 may be detected. According to an embodiment which may be combined with other embodiments described herein, the detected amplitude value 606a within the half-period 607 may be a maximum amplitude value 606a. By dividing the clock cycle 607 into five sample intervals 627, the sample intervals having approximately equal time width A, the maximum amplitude value 606a may be detected within the third time interval (central time interval) indicated in FIG. 6.

In accordance with the arrangement of the individual time intervals 627 as described above, both the set sample signal 612 and the reset sample signal 613 are adjusted in the respective time sample intervals. In accordance with an embodiment, the reset sample signal 613 is positioned in the second time interval, whereas the set sample signal 612 is positioned in the third time interval.

The expression "positioned" as used herein indicates a time period of the respective (digital) signal where the signal is on (or high). Moreover, the reference clock signal 605 may be on (or high) in the first and second time intervals, whereas the reference clock signal 605 may be off (or low) in the third, fourth and fifth time intervals. According to an embodiment which may be combined with other embodiments described herein the set sample signal 612 is set high at a point of time which may be related to a rising edge of the reference clock signal 605. For example, in the case shown in FIG. 6 the set sample signal 612 is set high after two sample intervals 627 have elapsed since the occurrence of the rising edge of the reference clock signal 605.

Figure 7:
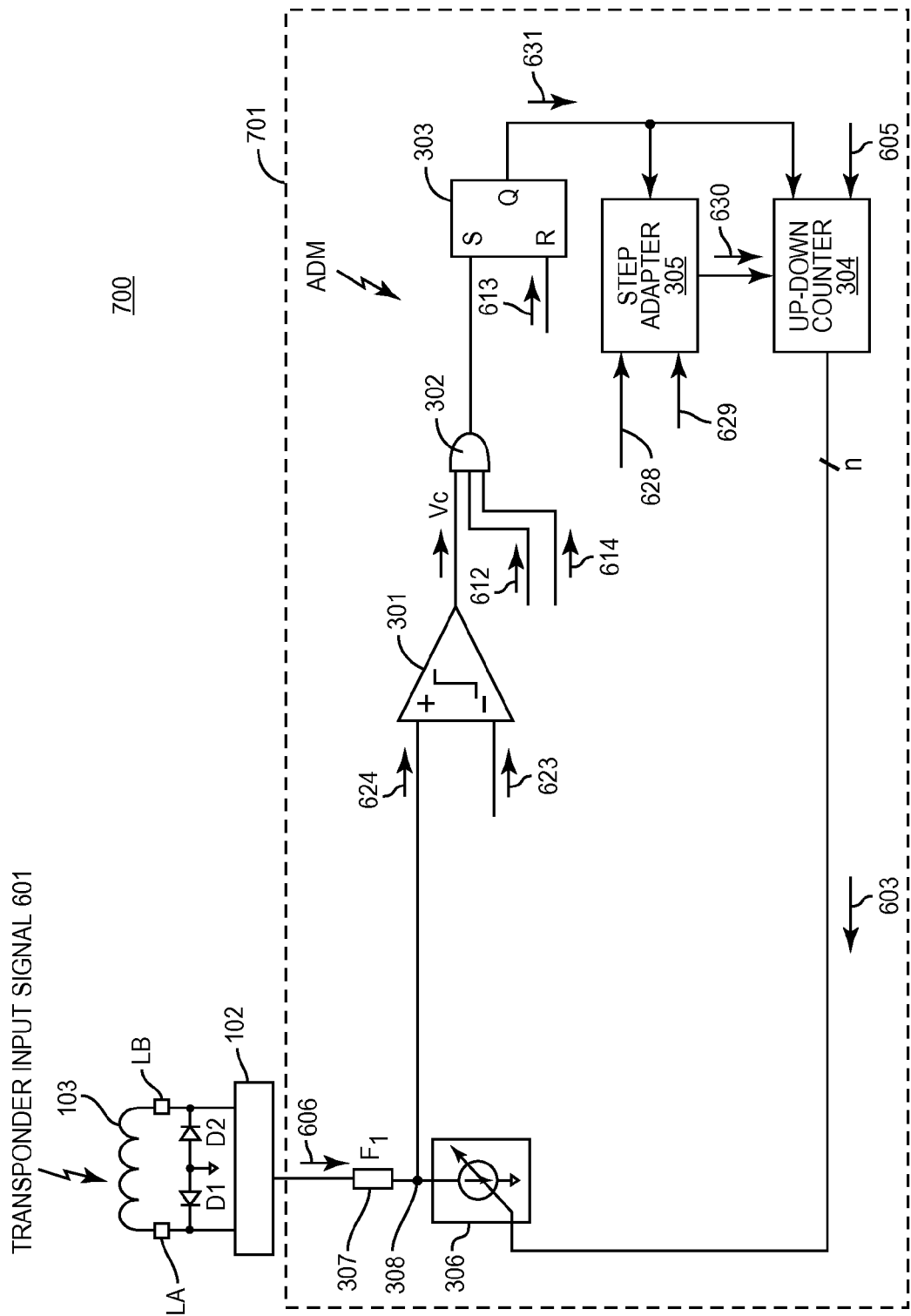
FIG. 7 is a detailed circuit diagram of a transponder circuit, according to an embodiment.

FIG. 7 is a detailed circuit diagram of a transponder circuit 700 including an amplitude determination unit 701 according to yet another embodiment which can be combined with other embodiments described herein. The antenna unit 103 receiving the transponder input signal 601 is connected to the combination unit 102 via the nodes LA and LB. The detection signal 606 output from the combination unit 102 is converted into a digital output signal 603 by an adaptive delta modulator (ADM) shown in FIG. 7.

Digital-to-analog conversion is performed using a controllable current source 306 in the ADM. As the amplitude value 606a changes, the codeword n (signal 603) changes correspondingly to hold a comparator input voltage 624 at a level which approximately corresponds to a comparator reference voltage 623 applied at the inverting input of a comparator 301. At an input node 308 a resulting voltage drop is present. An entire voltage drop $V_{LA/LB}-V_{bias}$ which corresponds to a voltage difference between the signal 606 ($V_{LA/LB}$) and the comparator reference voltage 623 ($V_{bias}$) is applied at a resistor 307 (R) which is used as input resistor for the converter unit 300. $V_{bias}$ corresponds to the comparator reference voltage 623, and a comparator input voltage 624 corresponds to a voltage which is applied at the input node 308.

An output signal of the comparator 301 is fed to a succeeding gate unit 302 which is provided as a logic NAND gate according to this embodiment. The NAND gate 302 has two more inputs, one input being supplied with the set sample signal 612 and one input being supplied with the locking signal 614. Thus a comparator output signal Vc may only be transferred through the NAND gate 302 if both the set sample signal 612 and the locking signal 614 are on (high), i.e., the comparator output signal Vc may only be transferred through the NAND gate within the third time interval 627 shown in FIG. 6, in a locked region 625 (FIG. 5).

The output of the NAND gate 302 is connected to a set input S of a latch unit 303. The reset input R of the latch unit 303 receives the reset sample signal 613 shown in the timing diagram 600 of FIG. 6. Thus, the amplitude value 606a may be converted on the basis of the synchronization signals, i.e., the set sample signal 612, the reset sample signal 613 and the locking signal 614. In particular, during the reset sample signal 613 pulse, the latch unit 303 is reset such that an output signal 631, i.e. an increment-decrement signal 631 provided for a succeeding up-down counter 304 is zero. During the pulse-on time of the set sample signal 612, the latch unit 303 can be set depending on the output signal Vc of the comparator 301 and on the locking signal 614. This results in an output signal of the latch unit 303, i.e., in an increment/decrement signal 631 to be set asynchronously, when the comparator input voltage $V_{in}$, i.e., the voltage 624, reaches its maximum.

A step adapter 305 is provided in the ADM to adapt a step height used in the adaptive delta modulator. A maximum value of the step defines a slew rate of the converter. Accordingly, the digital output signal 603, i.e., the codeword n, may change at most by a maximum step value 629 input into the step adaptor. The increment/decrement signal 631 is directed to the up-down counter 304 which provides the digital output signal 603. The digital output signal 603 also controls the current source 306 such that the comparator input voltage 624 is approximately equal to the comparator reference voltage 623. The step adapter 305 is provided with a minimum step value 628 and the maximum step value 629 in order to adjust the steps for the up-down counter 304. Thus the step adapter 304 is able to provide an adapted step value 630 for the up-down counter 304.

Figure 8:
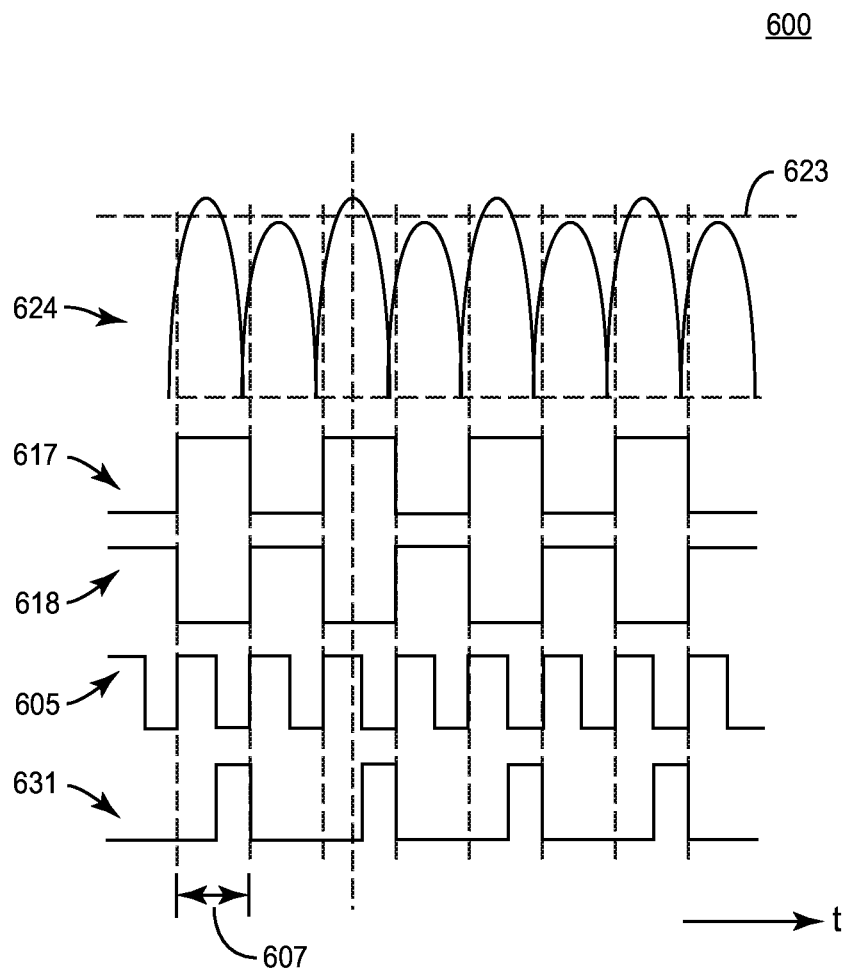
FIG. 8 shows a graph illustrating a signal timing diagram for the operation of the transponder circuit illustrated in FIG. 7.

FIG. 8 is a signal timing diagram 600 showing the operation of the circuit arrangement illustrated in FIG. 7. As shown in FIG. 8, the timing diagram 600 includes five different signals, i.e., the comparator input voltage 624 which is derived from the detection signal 606, the first clock signal 617 and the second clock signal 618, which have been described herein above with respect to FIG. 5, the reference clock signal 605 which is derived from the two first and second clock signals 617, 618 and which has twice the frequency as compared to the first and second clock signals 617 and 618, and the increment/decrement signal 631 which results from the output of the latch unit 303 which is controlled by the output of the gate unit 302 and the reset sample signal 613. Each time the comparator input voltage 624 exceeds the comparator reference voltage 623 indicated by a broken line, the increment-decrement signal 631 exhibits a pulse in the second portion of the clock cycle 607 of the reference clock signal 605.

As shown in FIG. 8, for constant values of both the comparator reference voltage 623 and the amplitude value 606a, the sequence of the increment-decrement signal 631 is periodic such as 01010101 . . . , i.e., the comparator input voltage 624 oscillates around the comparator reference voltage 623.

Figure 9:
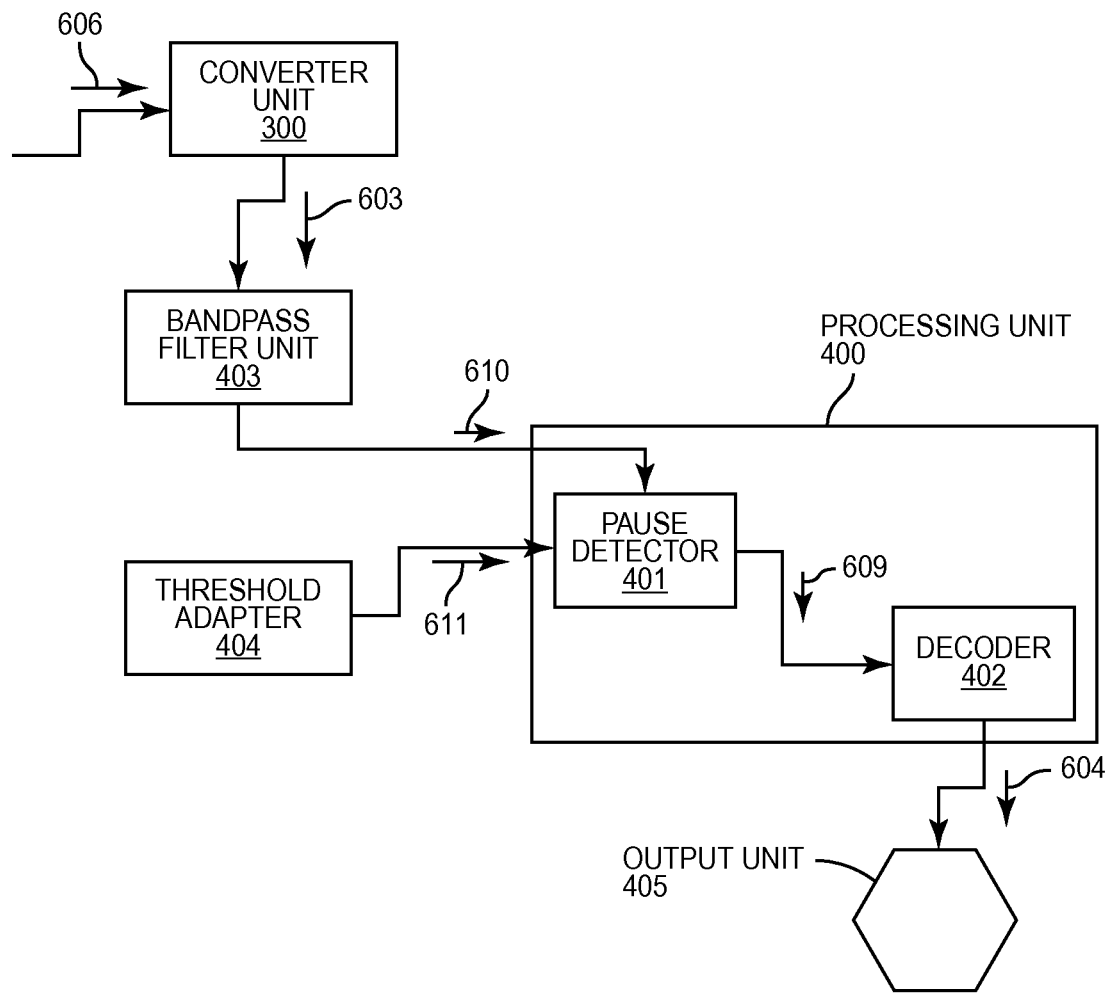
FIG. 9 shows a schematic block diagram of a converter unit connected to a processing unit via a bandpass filter unit, according to an embodiment.

FIG. 9 is a block diagram illustrating the use of a bandpass filter unit 403 which, according to another embodiment, may be connected between the converter unit 300 and the processing unit 400. The converter unit 300 and the processing unit 400 have been described herein above with respect to FIGS. 2, 3 and 7. As shown in FIG. 9, the output signal 603 of the converter 300, i.e., the digital output signal 603 or codeword n, is fed to the bandpass filter unit 403 such that a filtered digital output signal 610 or codeword m may be obtained as an output of the bandpass filter unit 403. According to another embodiment which may be combined with other embodiments described herein, the bandpass filter unit 403 may be included in the processing unit 400, i.e., the digital output signal 603 may be fed to the processing unit 400 where it is bandpass-filtered before further processing is carried out.

The filtered digital output signal 610 is fed to the pause detector 401 of the processing unit 400. The pause detector 401 obtains threshold values 611 which are provided by a threshold adapter 404. Thus, a decoded output signal 604 may be obtained at a higher accuracy, because the thresholds for determining the pause signal 609 by means of the pause detector 401 may be determined with a higher accuracy. The decoded output signal 604 again is output via an output unit 405.

Figure 10:
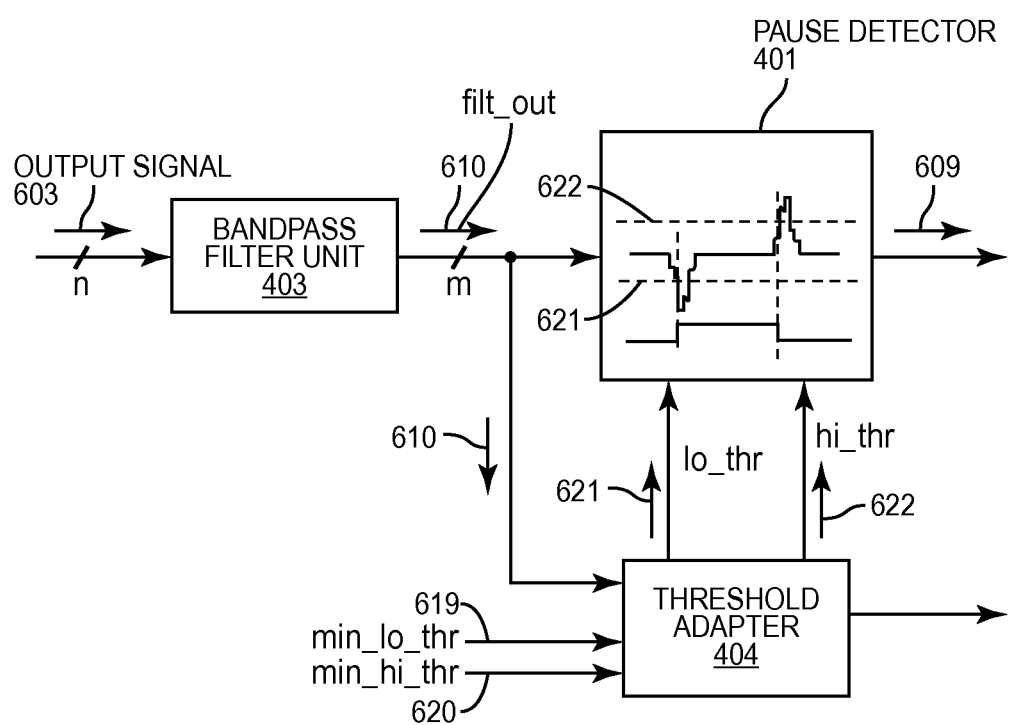
FIG. 10 is a detailed circuit diagram of the bandpass filter unit connected to a threshold adapter included in the circuit diagram shown in FIG. 9.

FIG. 10 is a more detailed block diagram of the filtering operation explained herein above with respect to FIG. 9. The digital output signal 603 or codeword n, which is fed to the bandpass-filter 403, is output as the filter digital output signal 610 or codeword m to the pause detector 401. According to a typical embodiment, the threshold values 611 may include a minimum low threshold signal min_lo_thr and a minimum high threshold signal min_hi_thr. Thus threshold adapter 404 may acquire two threshold values, i.e., a minimum low threshold value 619 and a minimum high threshold value 620. In the threshold adapter 404, the threshold values 619, 620 are processed and converted into a low threshold value lo_thr 621 and a high threshold value hi_thr 622, respectively. The threshold values 619-622 and their time behavior are indicated in a diagram in block 401 and are further detailed in a timing graph shown in FIG. 11.

Figure 11:
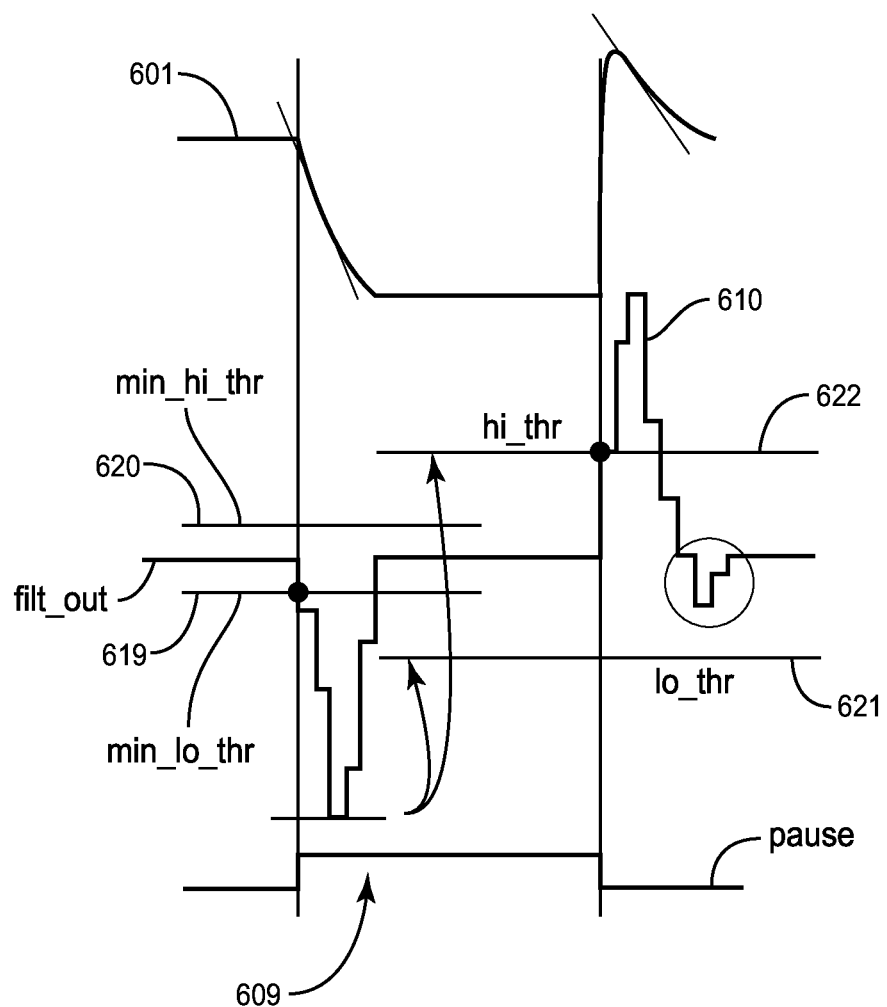
FIG. 11 is a graph showing a signal timing diagram of signals during an operation of the bandpass filter unit and the threshold adapter according to the embodiments depicted in FIGS. 9 and 10.

As shown in FIG. 11, the output threshold values 621 and 622 are used for a more accurate determination of the pause signal 609. In order to increase accuracy, the thresholds are not kept at a constant value, but they may be adapted during the operation of the entire circuit arrangement. This adaptation exploits a correlation between the speed of the envelope edges and overshoot amplitudes, i.e., waveforms with fast edges show high overshoots. A minimum value for both thresholds is given as the input parameter, i.e., as the minimum low threshold value 619 and as the minimum high threshold value 620. The threshold adaptation is performed by taking into account a minimum value of the codeword m. If its absolute value divided by a predetermined margin factor, which may amount to approximately three, is larger than min_lo_thr, then lo_thr is set equal to the filt_out minimum, which is output from the bandpass filter unit 403, divided by the margin factor. In a similar manner, if the filt_out minimum (in absolute value) divided by the margin factor is larger than min_hi_thr, then hi_thr is set equal to the filt_out minimum divided by the margin factor. Thus, the procedure shown in FIG. 11 is a countermeasure against overshoots.

Figure 12:
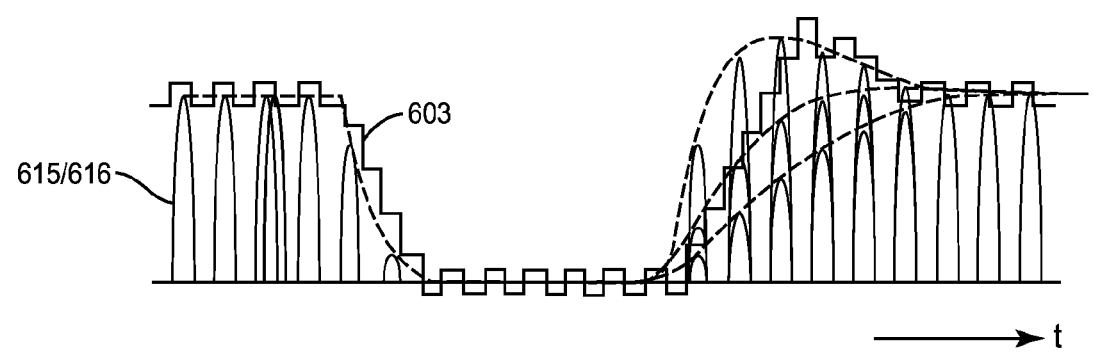
FIG. 12 is a graph showing a timing diagram of a digital output signal with respect to first and second antenna input signals.

FIG. 12 is a signal timing diagram illustrating the digital output signal 603 of the converter 300. As a reference, the first antenna input signal 615 and/or the second antenna input signal 616 may be considered. As shown in FIG. 12, the digital output signal 603 follows the pause modulation representing the communication information on the varying amplitude data, e.g., on the ASK signal.

Figure 13:
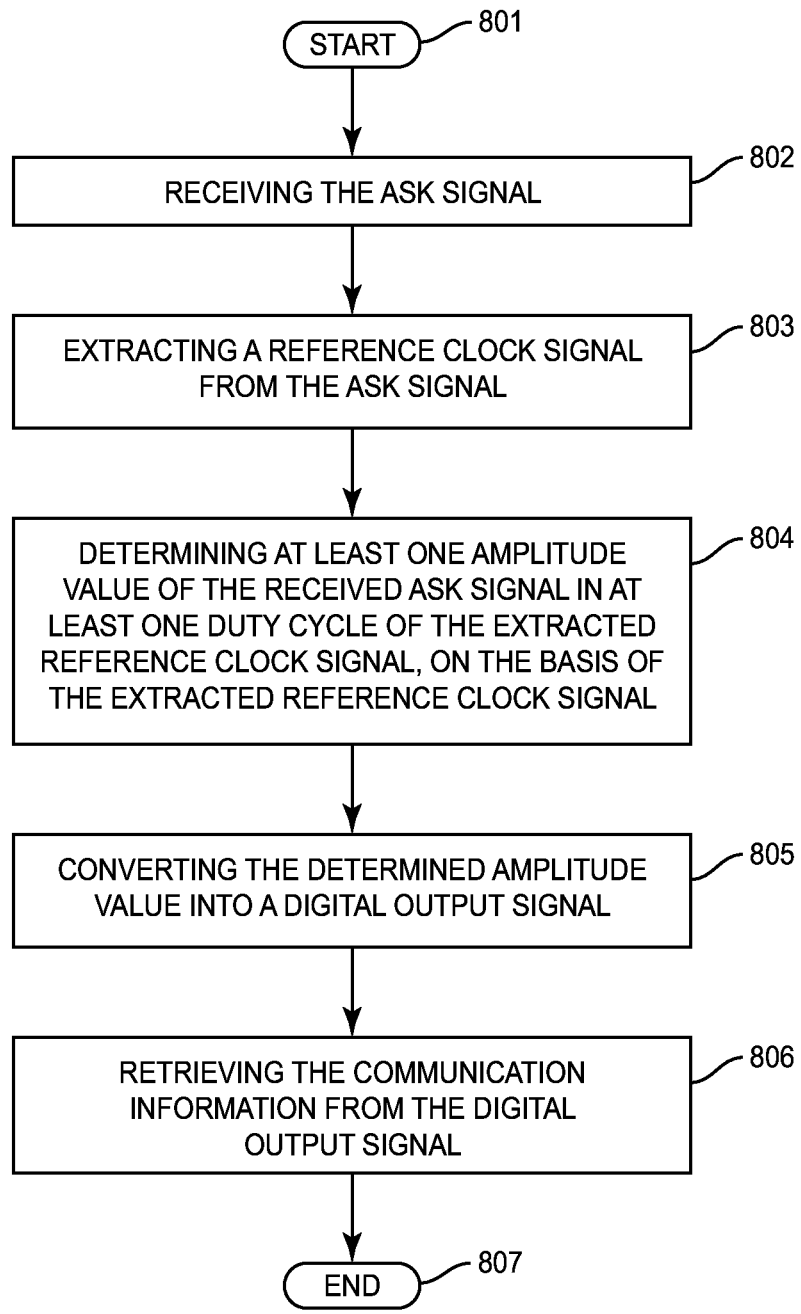
FIG. 13 is a flowchart illustrating a method for demodulating an ASK signal having modulated communication information according to an embodiment.

FIG. 13 is a flowchart illustrating a method for demodulating an ASK signal having modulated communication information. At a block 801, the procedure is started. Then, at a block 802, the ASK signal is received. The procedure advances to a block 803, where the reference clock signal 605 is extracted from the ASK signal.

In a block 804 the at least one amplitude value of the received ASK signal in at least one duty signal of the extracted reference clock signal 605 is determined on the basis of the extracted reference clock signal. The procedure advances to a block 805, where the determined amplitude value is converted in to a digital output signal 603. In a following block 806, the communication information is retrieved from the digital output signal 603 obtained in block 805. Then, in a block 807, the procedure is ended.

Terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A detector circuit for detecting at least one amplitude value of varying amplitude data, the detector circuit comprising:
  a data receiver configured to receive the varying amplitude data;
  a reference clock extractor coupled to the data receiver and configured to extract a reference clock signal from the varying amplitude data; and
  an amplitude determination unit coupled to the data receiver and the reference clock extractor, the amplitude determination unit configured to divide a half-period of the extracted reference clock signal into a plurality of equal time width sample intervals and to detect an amplitude value of the varying amplitude data within one of the equal time width sample intervals, wherein the amplitude determination unit further comprises a maximum detector, wherein the maximum detector is configured to detect a maximum value of the received varying amplitude data by detecting an amplitude value of the varying amplitude data only within the equal time width sample interval that coincides with an occurrence of a maximum in the varying amplitude data for each half-period of the extracted reference clock signal;
  a processing unit coupled to the amplitude determination unit and configured to process the amplitude value such that the communication information is retrieved; and a threshold adapter configured to adjust at least one of a low threshold value and a high threshold value used by the processing unit.

2. The detector circuit in accordance with claim 1, wherein the amplitude determination unit is configured to divide a half-period of the extracted reference clock signal into five equal time width sample intervals and to detect an amplitude value of the varying amplitude data within the central sample interval of the five equal time width sample intervals.

3. The detector circuit in accordance with claim 1, further comprising a control signal generator configured to generate at least one control signal based on the extracted reference clock signal, the control signal configured to control the maximum detector.

4. The detector circuit in accordance with claim 1, wherein the data receiver comprises an antenna unit configured to receive ASK signals.

5. A transponder circuit for receiving and processing an ASK signal having modulated communication information, the transponder circuit comprising:
a data receiver configured to receive the ASK signal;
a reference clock extractor coupled to the data receiver and configured to extract a reference clock signal from the ASK signal;
an amplitude determination unit coupled to the data receiver and the reference clock extractor, the amplitude determination unit configured to divide a half-period of the extracted reference clock signal into a plurality of equal time width sample intervals and to detect an amplitude value of the received ASK signal within one of the equal time width sample intervals, wherein the amplitude determination unit further comprises a maximum detector, wherein the maximum detector is configured to detect a maximum value of the received varying amplitude data by detecting an amplitude value of the varying amplitude data only within the equal time width sample interval that coincides with an occurrence of a maximum in the varying;
a processing unit coupled to the amplitude determination unit and configured to process the amplitude value such that the communication information is retrieved; and
a threshold adapter configured to adjust at least one of a low threshold value and a high threshold value used by the processing unit.

6. The transponder circuit in accordance with claim 5, further comprising a control signal generator configured to generate at least one control signal based on the extracted reference clock signal, the control signal configured to control the maximum detector.

7. The transponder circuit in accordance with claim 5, wherein the data receiver comprises an antenna unit configured to receive the ASK signal.

8. The transponder circuit in accordance with claim 5, wherein the processing unit comprises a decoder configured to decode the digital output signal and output a decoded output signal.

9. The transponder circuit in accordance with claim 5, wherein the amplitude determination unit comprises an adaptive delta modulator.

10. The transponder circuit in accordance with claim 9, wherein the adaptive delta modulator comprises a controllable current source.

11. The transponder circuit in accordance with claim 9, wherein the adaptive delta modulator further comprises an up-down counter configured to provide the digital output signal.

12. The transponder circuit in accordance with claim 11, wherein the adaptive delta modulator further comprises a step adaptor configured to adjust a step size of the up-down counter.

13. The transponder circuit in accordance with claim 5, further comprising a bandpass filter unit coupled between the converter unit and the processing unit and configured to bandpass filter the digital output signal.

14. A method for demodulating an ASK signal having modulated communication information, the method comprising:
receiving the ASK signal;
extracting a reference clock signal from the ASK signal;
determining an amplitude value of the received ASK signal in a clock cycle of the extracted reference clock signal by dividing a half-period of the clock cycle into a plurality of equal time width sample intervals and detecting an amplitude value of the received ASK signal within one of the equal time width sample intervals, wherein the amplitude determination unit further comprises a maximum detector, wherein the maximum detector is configured to detect a maximum value of the received varying amplitude data by detecting an amplitude value of the varying amplitude data only within the equal time width sample interval that coincides with an occurrence of a maximum in the varying;
converting the determined amplitude value into a digital output signal;
adjusting at least one of a low threshold value and a high threshold value and
retrieving the communication information from the digital output signal based on the adjusted threshold value.

15. The method in accordance with claim 14, further comprising generating at least one control signal based on the extracted reference clock signal, the control signal being selected from the group consisting of a set sample signal, a reset sample signal, a locking signal, or any combination thereof.

16. The method in accordance with claim 15, wherein converting the determined amplitude value into a digital output signal is controlled based on at least one of the set sample signal, the reset sample signal and the locking signal.

17. The method in accordance with claim 15, wherein a maximum amplitude of the received ASK signal is detected when the set sample signal is set over the equal time width sample interval that coincides with an occurrence of a maximum in the varying amplitude data.

18. The method in accordance with claim 17, wherein the maximum amplitude of the received ASK signal is periodically detected at a period of the clock cycle.

* * * * *